(12) United States Patent
Tatsumi et al.

(10) Patent No.: US 7,432,521 B2
(45) Date of Patent: Oct. 7, 2008

(54) LOGICAL OPERATION ELEMENT FIELD EMISSION EMITTER AND LOGICAL OPERATION CIRCUIT

(75) Inventors: Natsuo Tatsumi, Itami (JP); Yoshiki Nishibayashi, Itami (JP); Takahiro Imai, Itami (JP); Tsuneo Nakahara, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 630 days.

(21) Appl. No.: 10/526,471

(22) PCT Filed: Mar. 5, 2004

(86) PCT No.: PCT/JP2004/002840

§ 371 (c)(1),
(2), (4) Date: Mar. 3, 2005

(87) PCT Pub. No.: WO2004/079910

PCT Pub. Date: Sep. 16, 2004

(65) Prior Publication Data
US 2006/0044036 A1    Mar. 2, 2006

(30) Foreign Application Priority Data
Mar. 7, 2003   (JP)   ............................. 2003-061993

(51) Int. Cl.
*H01L 29/06*   (2006.01)
(52) U.S. Cl. .......................... 257/10; 257/11; 257/213; 313/103 R; 313/104; 313/106
(58) Field of Classification Search ................ 345/75.2, 345/75.1, 74.1; 257/10, 11, 213, 235–238; 313/103 R, 104, 106, 105 R; 315/169.3, 315/169.4; 977/939, 940
See application file for complete search history.

(56) References Cited

U.S. PATENT DOCUMENTS 5,589,738 A    12/1996   Onodaka et al.

(Continued)

FOREIGN PATENT DOCUMENTS

EP    0 513 777    11/1992

(Continued)

OTHER PUBLICATIONS

C.A. Spindt, et al. "Field-emitter-array development for microwave applications", Journal of Vacuum Science and Technology B, 14(3), pp. 1986-1989 (May/Jun. 1996).

(Continued)

*Primary Examiner*—Tuyet Vo
(74) *Attorney, Agent, or Firm*—McDermott Will & Emery LLP

(57) ABSTRACT

A logical operation element and logical operation circuit are provided that are capable of high speed and a high degree of integration.

A logical operation circuit has a construction wherein, in a logical operation element, the anodes of first and second field emission type microfabricated electron emitters are put at the same potential and two or more signal voltages are input to gate electrodes corresponding to these emitters. A NOR element so arranged that when a high potential input signal is input to either of the two lines, electron emission occurs from the emitters and the potential of said anodes is lowered, and a NAND element wherein the cathodes of the first and second field emission type microfabricated electron emitters are connected in series, two signal voltages are applied to the gate electrodes corresponding to the first and second emitter and the anode potential of the second emitter is lowered when the two input signals are high potential are employed.

22 Claims, 7 Drawing Sheets

U.S. PATENT DOCUMENTS

| | | | | |
|---|---|---|---|---|
| 5,689,278 A | * | 11/1997 | Barker et al. | 345/75.2 |
| 6,118,417 A | * | 9/2000 | Hush | 345/204 |
| 6,518,590 B1 | | 2/2003 | Hinton et al. | |
| 6,677,706 B1 | * | 1/2004 | Hara et al. | 313/496 |

FOREIGN PATENT DOCUMENTS

| | | |
|---|---|---|
| JP | 5-22119 | 1/1993 |
| JP | 7-181920 | 7/1995 |
| JP | 11-329263 | 11/1999 |
| JP | 2001-7696 | 1/2001 |

OTHER PUBLICATIONS

C.E. Holland, et al. "A Study of Field Emission Microtriodes", IEEE Transactions on Electron Devices, vol. 38, No. 10 (Oct. 1991).

European Search Report Dated Mar. 7, 2006.

* cited by examiner

I-V CURVE OF DIAMOND EMITTER

UPPER FACE VIEW
OF SMALL SURFACE
AREA ANODE

NAND ELEMENT $$A + B = \overline{\overline{(A+B)}}$$

$$A \cdot B = \overline{\overline{(A \cdot B)}} = \overline{(\overline{A} + \overline{B})}$$

(a)

(b)

NOT ELEMENT

NOR ELEMENT

NAND ELEMENT

LOGICAL OPERATION ELEMENT FIELD EMISSION EMITTER AND LOGICAL OPERATION CIRCUIT

TECHNICAL FIELD

The present invention relates to a logical operation element employing a cold cathode element that emits an electron beam, and logical operation circuit using the logical operation element.

BACKGROUND ART

Conventionally, MOSFET integrated circuits using Si substrates are employed for logical operation. Since these are solid-state devices, they are easy to handle and GHz operating frequencies have been achieved by the development of miniaturization techniques. Also, logical operation elements such as NOT, NOR and NAND gates and logical operation circuits by coupling these have been conceived and designed by use of MOS devices mainly.

To operate at higher frequencies than MOSFETs using Si substrates, chemical compound semiconductors such as GaAs are employed, and for specific applications, high-frequency amplification, vacuum valves are employed. Use of vacuum valves utilizes the fact that the mobility of carrier electrons is greater in vacuum than in the solid state.

Vacuum valves mostly utilize thermionic emission but Spindt type field emission type cold cathodes, in which a high current density can be obtained with low current consumption, may also be employed. High-frequency operation of such Spindt type field emission type cold cathodes is disclosed for example in: Journal of Vacuum Science and Technology B, 14 (1996) 1986. An example of use of such field emission type cold cathodes in integrated circuits is also disclosed in for example Japanese Patent Publication No. H. 11-329263.

However, there are restrictions on electron/hole mobility in solid-state devices made of for example Si that are currently widely employed in logical operation. Although progress has been made in achieving higher speeds by development of miniaturization techniques such as lithography, there are still limits on operating frequency.

On the other hand, there are problems regarding the degree of integration of vacuum valves capable of high-frequency operation. Also, since a Spindt type microfabricated cold cathode having a large number of elements in a small area has the property of large current density, applications have concentrated on for example microwave tubes or displays rather than logical operation.

Also, the operating voltage of these was high. This therefore led to the problems of large power consumption and withstanding voltage when reverse bias was applied. In addition, they could not be battery-driven and so could not be made portable.

When the field emission type cold cathode described in the aforementioned Japanese Patent Publication No. H11-329263 is employed in an integrated circuit, the element is of a planar form, so considerable area is required for the element layout. Japanese Patent Publication No. H11-329263 doesn't refer to a specific method of achieving integration when electron emission elements are connected for multistage operation.

DISCLOSURE OF THE INVENTION

The present invention was made in order to overcome these problems of the prior art, an object thereof being to provide a logical operation element and logical operation circuit capable of a high degree of integration and of high speed.

Specifically, success in solving the aforementioned problems was achieved by providing the following constitution.

(1) A NOR element of a design having the cathodes of two or more field emission type microfabricated electron emitters connected in parallel with a low potential power source or ground, two or more anodes corresponding to said emitters connected in parallel to a high potential power source through a passive element or an active element, the two or more anodes being substantially at the same potential, and gate electrodes corresponding to said emitters to be input two or more signal voltages, wherein the potential of said anodes is lowered by electron emission from the emitters when a high potential input signal is input to either of the two signals.

(2) The NOR element according to (1) wherein the anodes respectively corresponding to said two or more field emission type microfabricated electron emitters are constructed in a single plane.

(3) The NOR element according to (1) or (2), being operated at a voltage of no more than 10 V.

(4) A NAND element wherein an anode of a first field emission type microfabricated electron emitter and a cathode of a second field emission type microfabricated electron emitter are connected in series and two signal voltages are applied to gate electrodes corresponding to the first emitter and the second emitter so that the anode potential of the second emitter is lowered when the two input signals are high potential.

(5) The NAND element according to (4) wherein a cathode of the first field emission type microfabricated electron emitter and the cathode of the second field emission type microfabricated electron emitter are in the same plane, and the anode of the first emitter and the cathode of the second emitter are connected in series by a pillar-shaped electrode formed perpendicularly between the first emitter and the second emitter.

(6) The NAND element according to (4) wherein the anode of the first field emission type microfabricated electron emitter and the cathode of the second field emission type microfabricated electron emitter are connected in series in an integrated fashion.

(7) The NAND element according to any of (4) to (6) wherein there is no overlapping area when the anode of said first field emission type microfabricated electron emitter and the gate electrode of said NAND element are projected on an element plane.

(8) The NAND element according to any of (4) to (7), being operated at a voltage of no more than 10 V.

(9) A logical operation circuit including the NOR element of any of (1) to (3) and/or the NAND element of any of (4) to (8) as a logical operation element.

(10) The logical operation element according to (9), including a NOT element as a logical operation element wherein an anode potential of an output is changed by a potential that is input to the gate, by connecting the cathode of the field emission type microfabricated electron emitter with the low potential power source or ground, and connecting the anode thereof with the high potential power source through the passive element or active element.

(11) The logical operation circuit according to (9) or (10), comprising the NOT element and the NOR element, cathodes of their emitters being connected at the same potential to perform logical operation.

(12) The logical operation circuit according to any of (9) to (11) wherein a logical operation is connected by connecting an output anode of each element with a gate of another element either through a passive element or directly.

(13) The logical operation circuit according to any of (9) to (12) wherein two adjacent field emission type microfabricated electron emitters have a design in which the anode of one emitter and the gate of the other emitter are in the same plane, a design in which the anode of one emitter and the cathode of the other emitter are in the same plane, or a design combining said two designs.

(14) The logical operation circuit according to any of (9) to (13) wherein the cathodes, gates and anodes are in the same substrate plane and electrons are emitted in a direction parallel with the substrate surface.

(15) The logical operation circuit according to any of (9) to (14) wherein a non-doped semiconductor substrate is employed as the substrate of said elements, and the emitters are electrically isolated by providing a conductive doped region solely at a projection of the emitters or at a periphery thereof.

(16) The logical operation circuit according to any of (9) to (15) wherein an insulating layer of said elements comprises a material having a relative permittivity smaller than 4.

(17) The logical operation circuit according to any of (9) to (16) wherein the cathodes of said elements are diamond or a conductive material covered with a thin film of diamond.

(18) The logical operation circuit according to any of (9) to (16) wherein the cathodes of said elements are carbon nanotubes or a conductive material covered with carbon nanotubes.

(19) The logical operation circuit according to any of (9) to (16) wherein the cathodes of said elements are BN, AlN or GaN or a conductive material covered with a thin film of these.

(20) The logical operation circuit according to any of (9) to (19) wherein said elements are operated at a voltage of no more than 10 V.

EXPLANATION OF THE REFERENCE SYMBOLS

A input gate
B input gate
Z output anode
Z' terminal

DESCRIPTION OF THE PREFERRED EMBODIMENTS

Examples of the present invention are described below.

A NOT element, NOR element and NAND element which are logical operation elements constituting logical operation circuits according to present invention employ Spindt field emission type cold cathodes.

First of all, the design of a field emission type microfabricated electron emitter which is a basic logical element constituting a logical operation circuit according to the present invention will be described with reference to FIG. 1.

Figure 1:
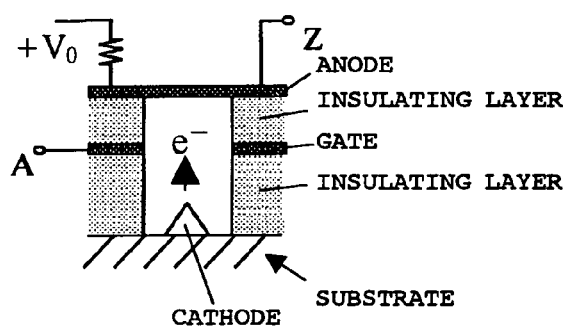
FIG. 1 is a view showing a design of a NOT element employing a field emission type microfabricated electron emitter and the circuit thereof.
Figure 1:
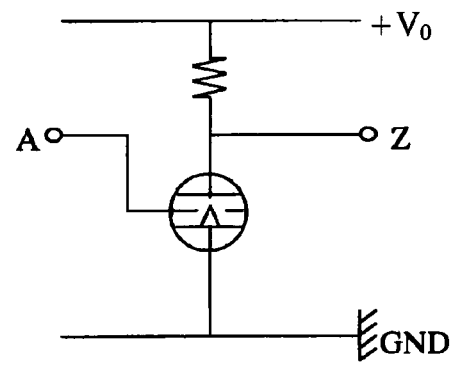

As shown in FIG. 1, a field emission type microfabricated electron emitter is formed by forming a cathode, insulating layer, gate and anode on a substrate. As the material of the cathode, apart from for example high melting point metals such as Mo or W, or Si there may be employed carbon nanotubes or diamond, which has negative electron affinity, or nitride semiconductors such as BN, AlN or GaN. Also, a conductive material such as Mo or Si may be employed whose surface has been coated with carbon nanotubes, diamond, or nitride semiconductor such as BN, AlN or GaN. There is no particular restriction on the method of conferring conductivity on the semiconductors, and for example n type carriers created by p type impurities, n type impurities or defects may be employed. As the material of the insulating layer, for example $SiO_2$, silicon nitride, silicon oxynitride, $Al_2O_3$, Or $CaF_2$ may be employed. For the gate and anode, high melting point metal such as Mo, Nb or Ta or high melting point metal silicide such as $WSi_2$ may be employed.

As the cathode, in particular diamond is preferable. Since diamond has negative electron affinity, it can be used to manufacture logical circuits that operate at low voltage and with low power consumption. Also, contrariwise, a large emission electron current can exhibit, and, in this case, the relaxation time of the NAND element can be reduced, as will be described. Since no insulating oxide layer is formed on the surface of diamond or carbon nanotubes, these can be operated as electron emitting elements even under comparatively low vacuum of about $10^{-6}$ Torr.

Wiring is provided as described below in order to constitute a NOT element using this field emission type microfabricated electron emitter. The anode is connected to a high potential power source through a passive element or active element. According to the present invention, the passive element may be a resistance or capacitor; for example polysilicon or tantalum nitride may be employed to provide the resistance, but there is no restriction to these materials. Also, as the active element, a transistor or a field emission type microfabricated electron emitter having different operating characteristics may be provided. The cathode is connected to a low potential power source or to ground. If the substrate is conductive, the cathode may be connected through the substrate. Also, the substrate may be insulating and connection with the cathode made by providing an electrode. FIG. 1 shows an example of the former. There may be a single or a plurality of cathodes.

The operation of a NOT element designed as described above will now be described. Electron emission is caused from the cathode when a voltage signal is input to the gate electrode, making the gate of high potential, and the anode potential is lowered. Contrariwise, if electron emission does not take place from the cathode when the gate is at low potential, the anode becomes high potential. Thus the negative of the input value is output as the anode potential.

Next, a NOR element according to the present invention will be described with reference to FIG. 2.

A NOR element is obtained by substituting the emitter portion of the aforementioned NOT element by two or more emitters whose anodes and cathodes are connected in parallel. In this case, electron emission occurs from the cathode when one or both of the input gates is high potential, causing the output anode to become low potential. Since electron emission does not occur from the cathode when both the input gates are low potential, the output anode becomes high potential i.e. it functions as a NOR element.

Figure 3:
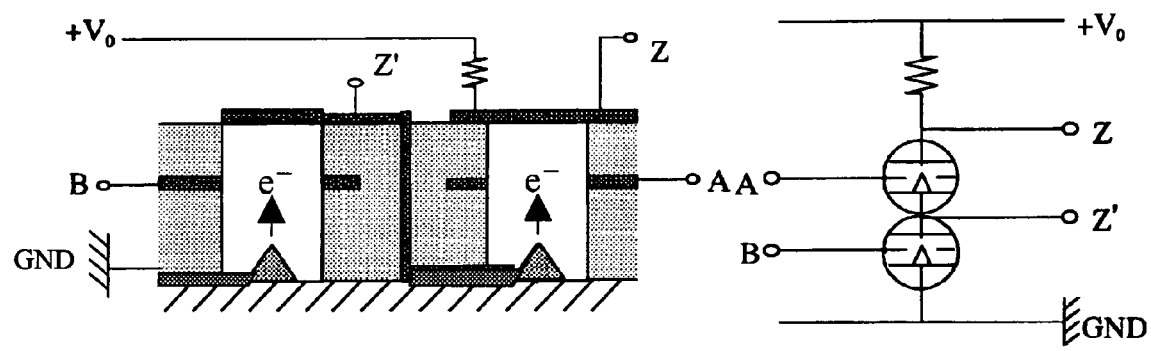
FIG. 3 is a view showing an example of the layout of a NAND element according to the present invention and the circuit thereof.

Next, a NAND element according to the present invention is described with reference to FIG. 3 to FIG. 9. As shown in FIG. 3, a NAND element is obtained by substituting the emitter portion of the aforementioned NOT element by two or more emitters whose anode and cathode are connected in series. In this case, electrical insulation must be provided between the cathodes of the two emitters. Also, the anode and cathode are connected in series using a pillar-shaped electrode formed perpendicularly between the first emitter and the second emitter. A connecting electrode of this shape makes it possible to further speed up operation by reducing the electrostatic capacitance compared with a planar electrode of large surface area.

Figure 6:
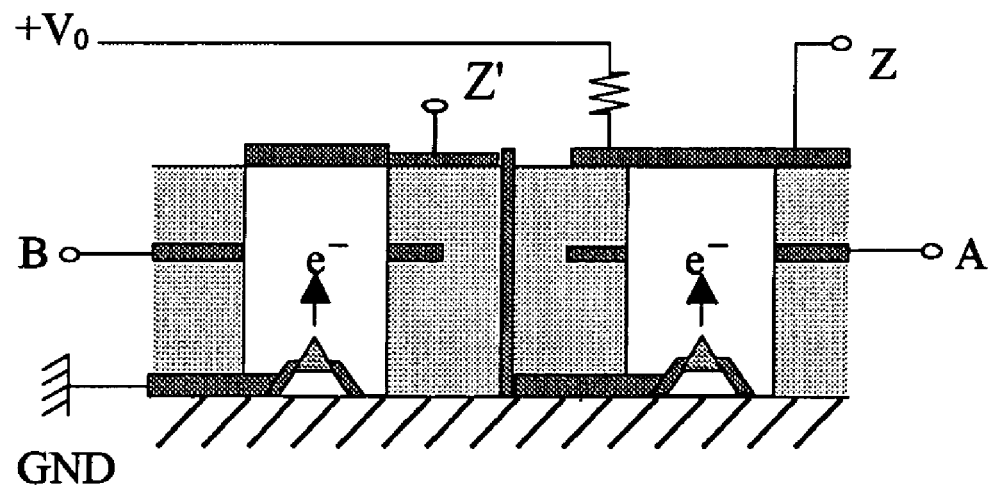
FIG. 6 is a view showing an example of the layout of a NAND element according to the present invention.

Using a insulating substrate of for example $SiO_2$ or $Al_2O_3$, a cathode made of metal such as Mo or W or Si or carbon nanotubes is formed on the substrate. A cathode could also be formed by providing a thin film of carbon nanotubes, diamond, BN, AlN or GaN, for example, on the surface of a conductive material such as Mo, W or Si. Also, as shown in FIG. 6, electrical conductivity could be conferred by using as the substrate a semiconductor having a large resistance when undoped, such as for example diamond and doping exclusively the region of the cathode.

The operation of this NAND element is that, when both input gates are high potential, electron emission occurs from all of the cathodes, causing the output anode to become low potential. When one or both of the input gates is low potential, electron emission does not occur from the cathode, and the output anode becomes high potential; thus the element functions as a NAND element.

Figure 7:
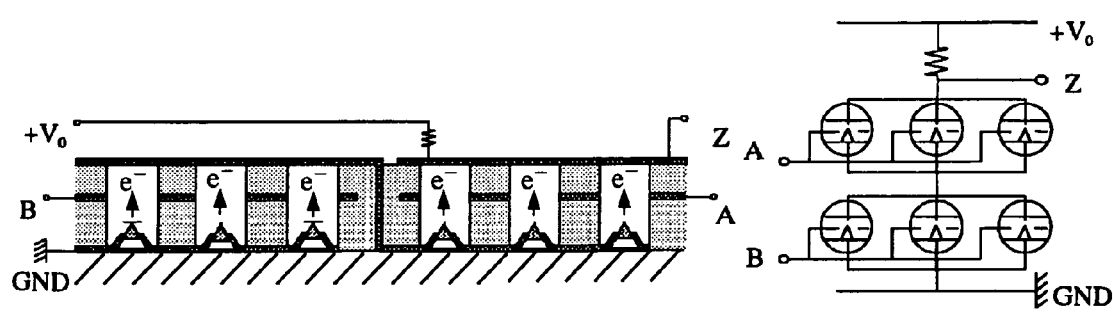
FIG. 7 is a view showing an example in which a NAND element according to the present invention is constituted from a plurality of emitters and the circuit thereof.

As described above, basic logical circuits i.e. a NOT element, a NOR element and a NAND element can be formed. Either single emitters or a plurality of emitters may be used to constitute these elements. FIG. 7 shows an example of a NAND element constituted of a plurality of emitters.

Also, as a result of repeated studies, the present inventors have discovered that the delay occurring in the operation of a NAND element depends on its input voltage. For example as shown in FIG. 3, when the input gate A is at high potential and the input gate B is at low potential, ideally no electron emission should take place, but, in fact, electron emission occurs from the cathode belonging to A and a relaxation time is necessary until a steady state has been reached in which the cathode has been raised in potential by being charged up. In order to lower the relaxation time it is therefore necessary to lower the electrostatic capacitance. The present inventors discovered that in particular the electrostatic capacitance between the anode and the gate connected with the cathode may be reduced in order to speed up operation by shortening the relaxation time.

Figure 8:
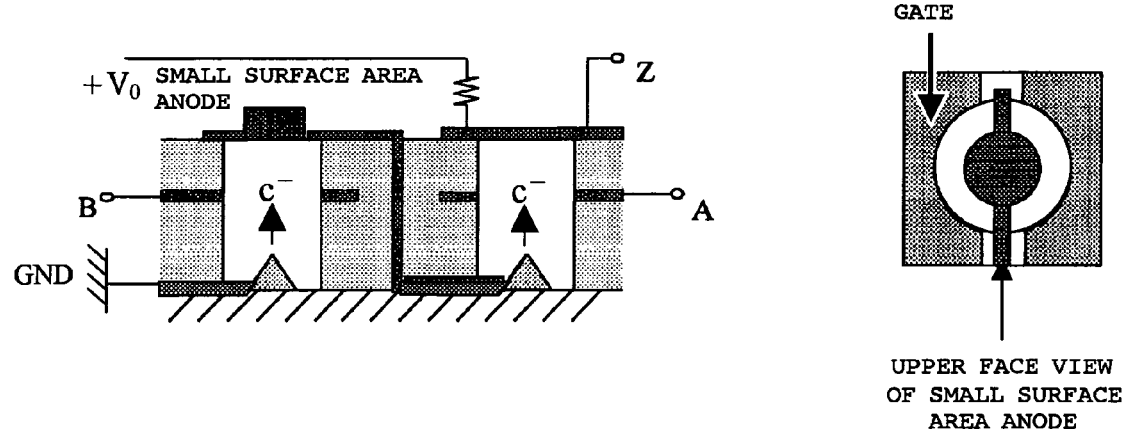
FIG. 8 is a view showing an example in which, in a NAND element according to the present invention, it is arranged that there is no overlap of area between the anode and gate.

In general, the electrostatic capacitance C of parallel flat plates is expressed by $C=\epsilon S/d$, where $\epsilon$ is the permittivity, S is the area and d is the inter-electrode distance. d is difficult to change due to the structure of the element. Also, although a prior art example has been found [IEEE Trans. Elec. Dev., 38 (1991) 2368] of lowering of the electrostatic capacitance by reducing the overlapping area S of the cathode and gate, it cannot be achieved that the electrostatic capacitance is made sufficiently small. The electrostatic capacitance can be reduced by adopting a construction in which there is no overlapping area when the gate and anode are projected onto the substrate surface as shown in FIG. 8 and the amount of charge can thereby be reduced. The plane of FIG. 8 shows a plane in which there is no overlapping area.

Also, materials such as $SiO_2$ or $Al_2O_3$ were employed for the insulating layer in a conventional Spindt cold cathode, but their relative permittivity was 4 or more. However, if a material of relative permittivity of less than 4, such as SiOF or SiOCH, porous dielectric or organic polymer is used for the insulating layer, the electrostatic capacitance can be made smaller than conventionally, making it possible to speed up the operation of a NAND element. Also, in order to lower the permittivity to the limit, a vacuum may be provided between the electrodes instead of an insulating layer.

Figure 9:
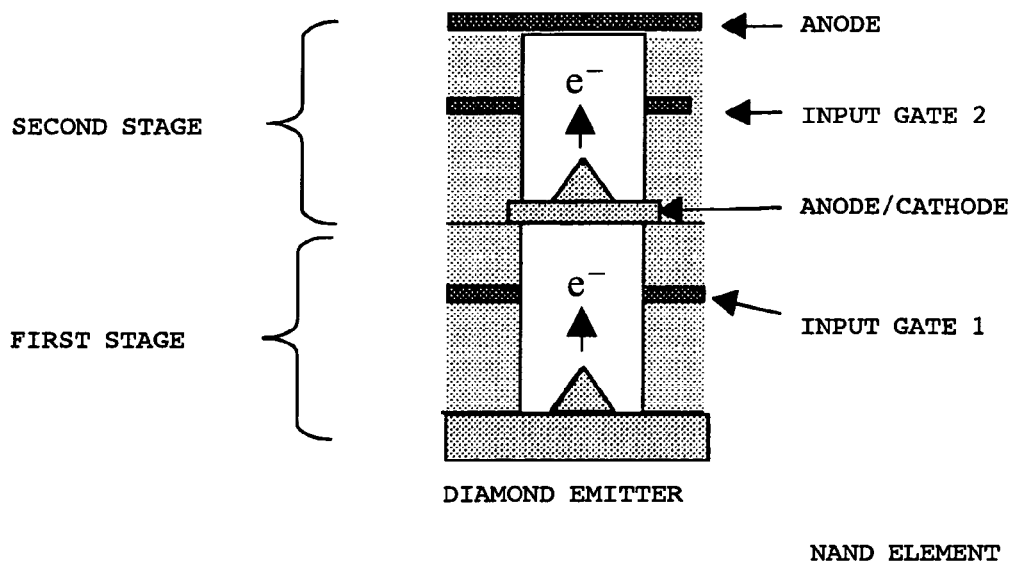
FIG. 9 is a view showing an example in which, in a NAND element according to the present invention, the anode and cathode are integrated.

Furthermore, if a design is adopted in which, as shown in FIG. 9, the anode of a first emitter and the cathode of a second emitter are integrated, operation of the NAND element can be speeded up, since the electrostatic capacitance that would be produced by the extra wiring is not generated.

Although operation of a AND element can be speeded up by adopting a method as described above, delay is inevitably generated in the operation of a NAND element. A logical operation circuit may therefore be constituted using solely a NOT element and NOR element instead of using a NAND element. If this is done, addition to the function of speeding up operation, it is possible to make all of the cathodes of the same potential, as seen in FIGS. 1 and 2. Consequently, whereas, in the case of a conventional electron emission element, it was necessary to employ insulating material on the substrate to hold the cathodes, according to the present invention, conductive material such as metal may be employed.

Also, if a semiconductor material such as diamond is employed for the cathode material, the cathode and the entire underlying substrate can be simultaneously put in a conductive condition by doping. Conventionally, Substrates that were made conductive in this way were employed in large-current applications such as electron beam devices where all the cathodes have the same function. However, the design according to the present invention has the characteristic feature that was not found conventionally that, while the substrate has conductivity, the individual cathodes function independently.

Figure 10:
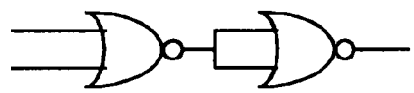
FIG. 10 is a view showing a logical operation circuit that performs OR operation according to the present invention.
Figure 10:
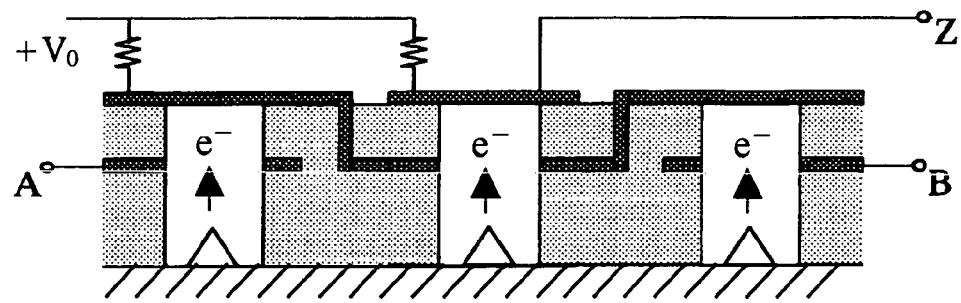
Figure 11:
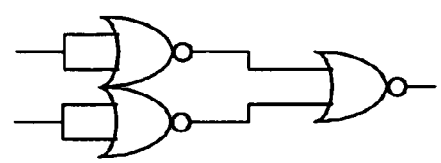
FIG. 11 is a view showing a logical operation circuit that performs AND operation according to the present invention.
Figure 11:
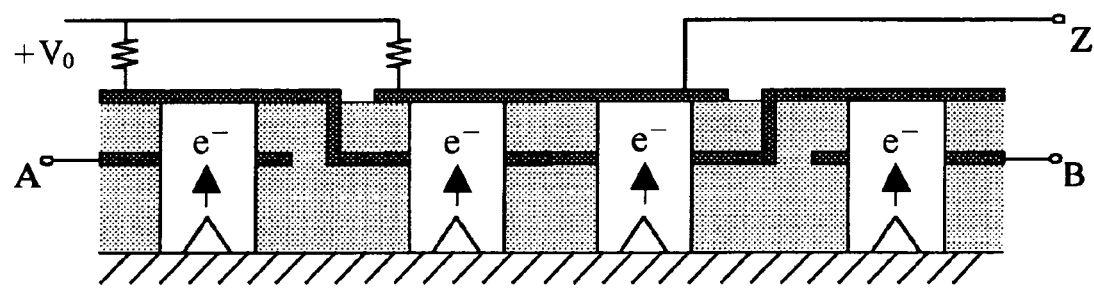

In order to combine the logical operations, as shown in FIG. 10 and FIG. 11, a construction in which the electrode positions are arranged in order to match the electrode positions is formed between the emitters.

Figure 12:
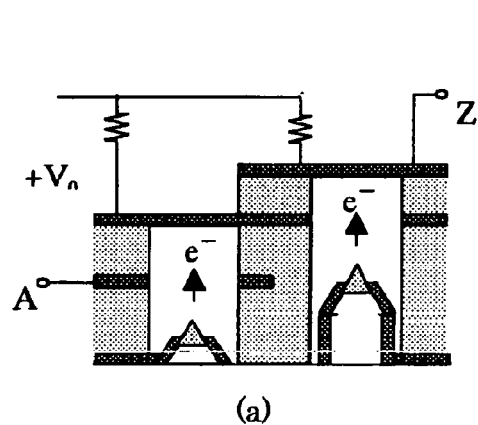
FIGS. 12(a) and 12(b) are views showing an example of a logical operation circuit according to the present invention, having a design in which electrodes of different elements are arranged in the same plane.
Figure 12:
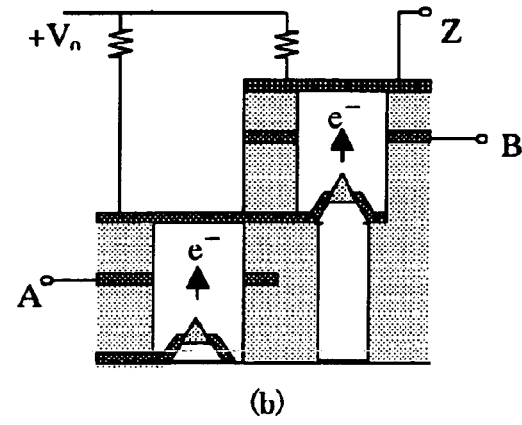

However, with this design, the positional relationship with the emitters had to be crafted such as to secure insulation of the electrodes, or the electrodes had to be adjacent, with the result that electrostatic capacitance was produced, causing delays in operation. Accordingly, the electrodes are manufactured such that, as shown in FIG. 12(*a*), the anode and gate are arranged in the same plane to make connection or, as shown in (*b*), the anode and cathode are arranged in the same. If this is done, electrostatic capacitance as referred to above is not generated and, in addition, electrode wiring to match up the positions is unnecessary, so the surface density of the cathodes can be increased. Consequently, a circuit of higher surface density than conventionally can be manufactured.

Figure 13:
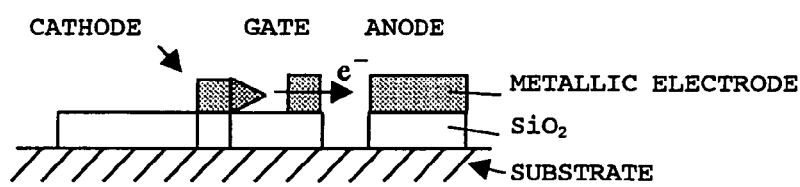
FIG. 13 is a view showing an example of a logical operation circuit according to present invention in which the cathode, gate and anode are in the same substrate plane and electrons are arranged to be emitted in a direction parallel with the substrate surface.
Figure 13:
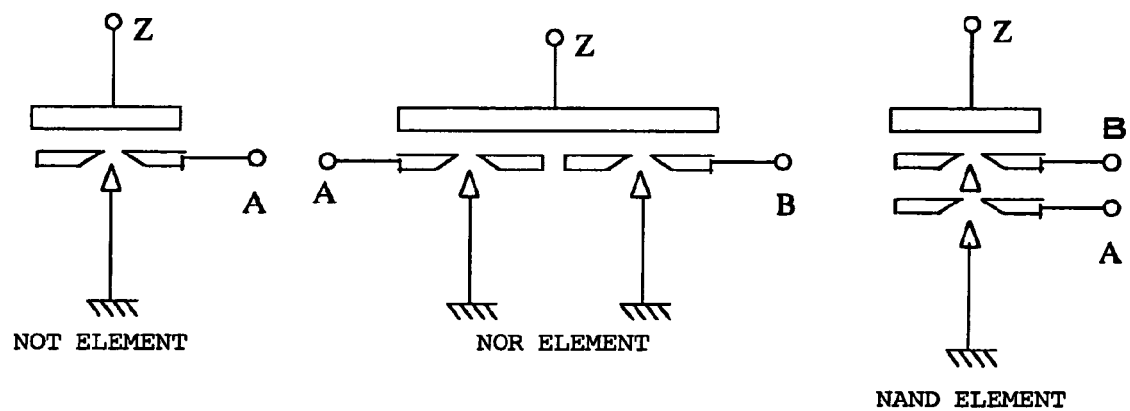

For such arrangements, the electrons can be emitted perpendicularly to the plane of the substrate when a large number of cathodes are arranged on the plane as in the case of Spindt type cathodes, or, as shown in FIG. 13, the electrons can be emitted parallel with the substrate plane. With this, the electrodes such as the gate and anode can be simultaneously formed so that the steps involved in manufacturing complicated logical operation circuits can be simplified. In addition, in this constitution, vacuum could be employed for insulation, thereby decreasing the permittivity and enabling the operating delay to be reduced. Also, if a material of high thermal conductivity such as diamond is employed for the substrate, this functions as a heat sink for the heat generated by the drive power during operation, acting as a remedy for the heat generation by the logical operation circuit.

EXAMPLES

Implementation of the present invention is described below based on the Examples. However, the scope of the present invention is not intended to be restricted by these Examples.

Example 1

Figure 2:
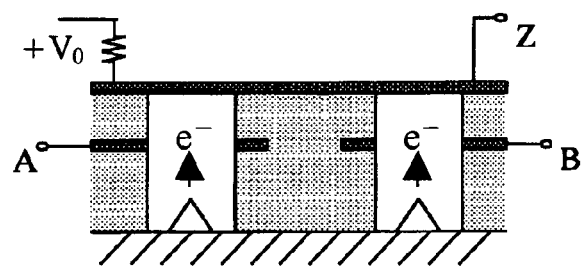
FIG. 2 is a view showing an example of the layout of a NOR element according to the present invention and the circuit thereof.
Figure 2:
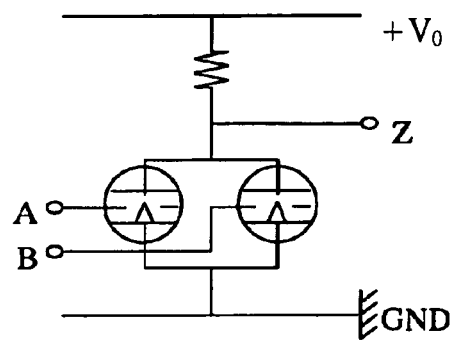

In this Example, NOT, NOR and NAND elements were manufactured of the basic cross-sectional structure and electrical circuitry shown in FIG. 1 to FIG. 3. The cathodes of the NOT and NOR were grounded and the cathode of the second emitter of the NAND was connected through a pillar-shaped Mo electrode with the anode of the first emitter. The diameter of the pillar-shaped Mo electrode was 0.5 µm. One electron emitter was a Spindt cold cathode, the substrate was $SiO_2$, the cathode was an Mo protrusion, the insulating layer was $SiO_2$, and the gate and anode were Mo. The emitter height was 2 µm, its diameter 0.5 µm, the gate aperture diameter 0.8 µm, the gate height 0.8 µm and the distance between gate and anode was 0.5 µm. In this construction, the gate capacitance Cg was 2.2 pF, and the mutual conductance was 35 ms. The separation between the emitters was 5 µm, and the emitter density was $4 \times 10^6$ emitters/cm². Elements were manufactured in which emitters of the basic construction of FIG. 1 to FIG. 3 were integrated. The elements were capable of operating at a frequency of 10 GHz.

Example 2

In this Example, as the substrate, a diamond substrate comprising an Ib single-crystal synthesized under high pressure, having a (111) plane at the surface was employed. On this diamond substrate, there was formed a phosphorus-doped diamond film of thickness 1 µm, under the conditions: hydrogen 200 sccm, methane 1 sccm, phosphine flow rate $PH_3/CH_4$=0.1%, pressure 100 Torr, sample temperature 870° C., using the method of microwave plasma CVD.

Next, a film of Al was deposited by the sputtering method and a dot pattern of 1 µmφ was manufactured by a photolithographic process. This was etched to 1.5 µm at a pressure of 50 mTorr, using the conditions: oxygen 50 sccm, $CF_4$ gas 0.5 sccm, by RIB. Projections of height 1 µm were formed, with an electrically conductive P doped region extending from the tip of the projection for 0.5 µm, thereby achieving electrical isolation of the emitters.

Figure 4:
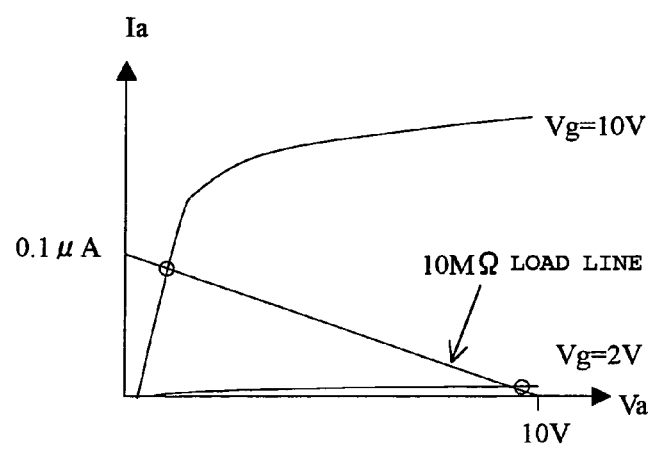
FIG. 4 is a view showing the current characteristic of field electron emission of an emitter employing an element according to the present invention.

FIG. 4 shows the current voltage characteristic of field electron emission of the emitters shown in FIG. 1 manufactured in this way. The load resistance was 10 MΩ. It was found that an OFF condition was produced in which there is no electron emission with gate voltage of no more than 2 V (Vg=2 V) and that an ON condition in which electrons were emitted was produced with gate voltage of 10 V (Vg=10 V).

Figure 5:
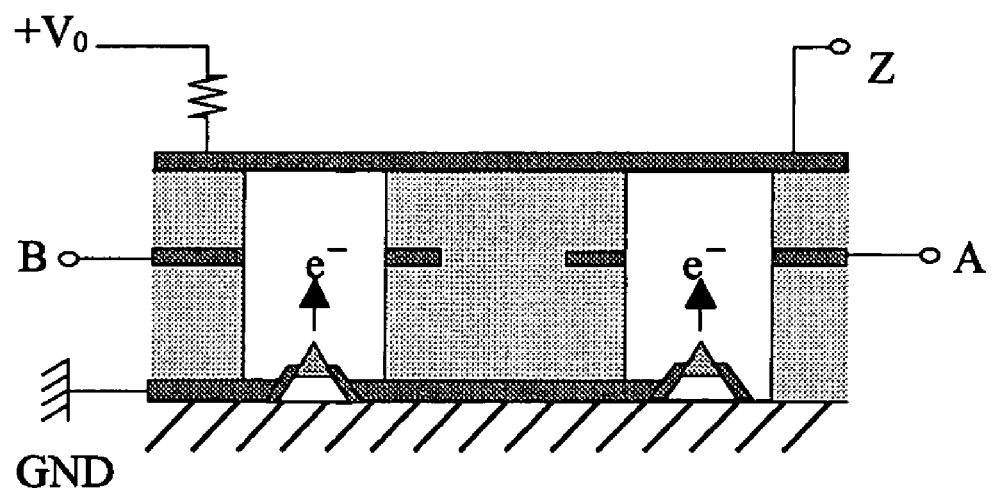
FIG. 5 is a view showing an example of the layout of a NOR element according to the present invention.

Next, NOR and NAND elements as shown in FIGS. 5 and 6 were manufactured. In the case of a NOR element, Mo electrodes were arranged above and below the emitter; in the case of a NAND element, pillar-shaped Mo electrodes were arranged perpendicularly between the first emitter and the second emitter, the anode electrode of the first emitter being connected with the doped region of the cathode of the second emitter by means of this pillar-shaped Mo electrode. The operating voltages of these respective elements are shown in Table 1 and 2. As can be seen from Table 1, in the case of the NOR element, a low-voltage condition of the output voltage of no more than 2 V was produced by making one or both gate voltages 10 V; if both the gate voltages were put in low-voltage condition, the output voltage was put in a high-voltage condition of 10 V. Also, from Table 2, in the case of the NAND element, the output voltage when both gate voltages were in high-voltage condition of 10 V was put in a low voltage condition. Thus, it was found that if the emitter material is diamond, low voltage operation of no more than 10 V can be achieved.

TABLE 1

Voltage of terminals of NOR element

| | Terminal | | |
|---|---|---|---|
| | A | B | Z |
| Operating Voltage (V) | 10 | 10 | 1.6 |
| | 10 | 0 | 2 |
| | 0 | 10 | 2 |
| | 0 | 0 | 10 |

TABLE 2

Voltage of terminals of NAND element

| | Terminal | | | |
|---|---|---|---|---|
| | A | B | Z' | Z |
| Operating Voltage (V) | 0 | 0 | 0 | 10 |
| | 10 | 10 | 0.9 | 1.8 |
| | 0 | 10 | 0 | 10 |
| | 10 | 0 | 9 | 10 |

Example 3

As described above, in the case of a NAND element, a relaxation time is required, depending on the input values.

Accordingly, the electrode pattern of the NAND element of Example 1 was changed to that shown in FIG. 8 in order to reduce the electrostatic capacitance and decrease the relaxation time. In this pattern, it was arranged that there should be no overlapping area when the anode and the gate of the first emitter were projected onto the element plane. In this way, the electrostatic capacitance was lowered to 1.1 pF and a reduction in the relaxation time was achieved, compared with the prior art design in which there is overlapping.

Example 4

A cathode, anode and gate were formed using Mo on an $SiO_2$ substrate in the same way as in the case of Example 1. And, NOT elements, NOR elements and NAND elements were manufactured using SiOF as the insulating material between the electrodes. The relative permittivity of this SiOF was 3.6, so the electrostatic capacitance was reduced to 2.0 pF using the same element construction as in the case of Example 1.

Example 5

An increase in operating speed can be achieved by the Examples 3 and 4, but electrostatic capacitance is generated between the electrodes and the nearby gate due to the passage of current from the first emitter to the second emitter. Accordingly, in order to shorten the wiring to the limit that can be achieved, the anode and emitter were integrated as shown in FIG. 9 by modifying the NAND element of Example 3. In this way, the electrostatic capacitance between the gate and anode of the first emitter, the electrostatic capacitance between the cathode and gate of the second emitter and the electrostatic capacitance generated at the peripheral electrode and the pillar-shaped electrode connecting the upper and lower electrodes are simultaneously reduced, making it possible to achieve a reduced relaxation time.

Example 6

As the substrate, a diamond substrate was employed comprising an Ib single-crystal synthesized under high pressure, having a (100) plane at the surface. On this diamond substrate, there was formed a boron-doped diamond film of film thickness 10 μm, under the conditions: hydrogen 100 Sccm, methane 6 sccm, diborane gas flow rate $B_2E_6/CH_4=167$ ppm, pressure 40 Torr, sample temperature 830° C., using the method of microwave plasma CVD.

Next, a film of Al was deposited by the sputtering method and a dot pattern of 1 μmφ was manufactured by a photolithographic process. This was etched to 1.5 μm, using oxygen and $CF_4$ gas; projections of height 1 μm were formed. The entirety of the cathodes was earthed by attaching an electrode to the side face of the diamond substrate. A logical operation circuit was then formed comprising a NOT element and a NOR element, by forming gates, anodes and an insulating layer using Mo and $SiO_2$.

The number of processing steps can be omitted, since the element construction is simpler than in the case of the element manufactured in Example 2.

Likewise, a logical operation circuit comprising a NOT element and a HAND element was constructed by the same steps as in the case of Example 2, by forming a boron-doped diamond layer of film thickness 1 μm. Comparing the operation tine of the logical operation circuit which was thus obtained and that of a logical operation circuit which was manufactured as previously, it was found that the total relaxation time was shorter in the case where only a NOT element and NOR element were employed.

Example 7

The output anode of a first element was arranged to be connected in the same plane with the gate or cathode of the next element by modifying the NOR element and NAND element of Example 1 and altering the height of the emitter as shown in FIG. 12. In this way it was possible to increase the number of elements per unit area since there was no need to provide an insulating layer margin in the transverse direction in order to guarantee maintenance of insulation.

An operation circuit was manufactured comprising 100 NOT elements, by providing an insulating layer of 1 μm between the elements and electrodes. Whereas in the case of an operation circuit manufactured with the prior art construction, an area of 2500 μm$^2$ would have been necessary, with the new construction, a reduction in area to 900 μm$^2$ was achieved.

Example 8

An $SiO_2$ insulating layer and Mo metal electrodes were formed on a substrate and emitters, gates and anodes were then formed to the same height from the substrate surface as shown in FIG. 13 by a photolithographic process and etching. NOT elements, NOR elements and NAND elements were then formed as shown in the bottom portion of the Figure as an electrode pattern.

Whereas in the case of Example 1 a minimum of four deposition processes for the insulating layer, gate, insulating layer and anode were necessary, a logical operation circuit can be formed with two deposition steps with the construction of this Example, namely, for the insulating layer and the electrodes.

Furthermore, since there is still sufficient strength in the transverse direction notwithstanding the vacuum between the electrodes, the electrostatic capacitance between the electrodes is reduced, making it possible to achieve high-speed operation.

Example 9

A logical element of the construction of Example 1 was manufactured. Fe was then evaporated onto the cathode projections as a catalyst and carbon nanotubes were formed on the projections under the conditions: hydrogen 100 sccm, $CH_4$ 20 sccm, pressure 2 Torr, substrate temperature 600° C., using the microwave plasma CVD method. The logical operation circuit that was obtained operates at lower voltage than a logical operation circuit in which Mo cathodes having the same circuit layout are employed, making it possible to reduce the power required for operation.

Example 10

A thin BN film of 20 nm thickness was formed on the Si surface of an n type Si substrate that had been formed with projections of the same shape as in Example 1, using $BCl_3$ and $N_2$ gas, by the plasma-assisted CVD method. After this, a logical operation circuit was manufactured by forming an insulating layer and gate and anode electrodes. The logical operation circuit that was obtained operates at lower voltage than a logical operation circuit in which Si cathodes that were not coated with the thin BN film but having the same circuit layout are employed, making it possible to reduce the power required for operation.

INDUSTRIAL APPLICABILITY

As described in detail above, a logical operation circuit according to the present invention employs basic logical elements of high density wherein field emission type cold cathodes are employed to achieve high electron mobility, so the relaxation time that is produced when the individual elements perform logical operations can be reduced and power consumption diminished and high-speed operation achieved; also, the manufacturing process is straightforward and convenient and involves few steps, so manufacturing costs can be reduced. Thus, effects can be obtained that cannot be realized simply by a combination of a vacuum tube and cold cathode.

The invention claimed is:

1. A NOR element of a design having the cathodes of two or more field emission type microfabricated electron emitters connected in parallel with a low potential power source or ground, two or more anodes corresponding to said emitters connected in parallel to a high potential power source through a passive element or an active element, the two or more anodes being substantially at the same potential, and gate electrodes corresponding to said emitters to receive two or more signal voltages, wherein the potential of said anodes is lowered by electron emission from the emitters when a high potential input signal is input to either of the two signals.

2. The NOR element according to claim 1 wherein the anodes respectively corresponding to said two or more field emission type microfabricated electron emitters are constructed in a single plane.

3. The NOR element according to claim 1 or 2, being operated at a voltage of no more than 10 V.

4. A logical operation circuit including the NOR element of as a logical operation element.

5. The logical operation circuit according to claim 4 wherein a logical operation is connected by connecting an output anode of each element with a gate of another element either through a passive element or directly.

6. The logical operation circuit according to claim 4 wherein two adjacent field emission type microfabricated electron emitters have a design in which the anode of one emitter and the gate of the other emitter are in the same plane, a design in which the anode of one emitter and the cathode of the other emitter are in the same plane, or a design combining said two designs.

7. The logical operation circuit according to claim 4 wherein the cathodes, gates and anodes are in the same substrate plane and electrons are emitted in a direction parallel with the substrate surface.

8. The logical operation circuit according to claim 4 wherein a non-doped semiconductor substrate is employed as the substrate of said elements, and the emitters are electrically isolated y providing a conductive doped region solely at a projection of the emitters or at a periphery thereof.

9. The logical operation circuit according to claim 4 wherein an insulating layer of said elements comprises a material having a relative permittivity smaller than 4.

10. The logical operation circuit according to claim 4 wherein the cathodes of said elements are diamond or a conductive material covered with a thin film of diamond.

11. The logical operation circuit according to claim 4 wherein the cathodes of said elements are carbon nanotubes or a conductive material covered with carbon nanotubes.

12. The logical operation circuit according to claim 4 wherein the cathodes of said elements are BN, AlN or GaN or a conductive material covered with a thin film of these.

13. The logical operation circuit according to claim 4 wherein said elements are operated at a voltage of no more than 10 V.

14. The logical operation element according to claim 4, including a NOT element as a logical operation element wherein an anode potential of an output is changed by a potential that is input to the gate, by connecting the cathode of the field emission type microfabricated electron emitter with the low potential power source or ground, and connecting the anode thereof with the high potential power source through the passive element or active element.

15. The logical operation circuit according to claim 14, further comprising the NOT element and the NOR element, cathodes of their emitters being connected at the same potential to connect logical operation.

16. A NAND element wherein an anode of a first field emission type microfabricated electron emitter and a cathode of a second field emission type microfabricated electron emitter are connected in series and two signal voltages are applied to gate electrodes corresponding to the first emitter and the second emitter so that the anode potential of the second emitter is lowered when the two input signals are high potential.

17. The NAND element according to claim 16 wherein a cathode of the first field emission type microfabricated electron emitter and the cathode of the second field emission type microfabricated electron emitter are in the same plane, and the anode of the first emitter and the cathode of the second emitter are connected in series by a pillar-shaped electrode formed perpendicularly between the first emitter and the second emitter.

18. The NAND element according to claim 16 wherein the anode of the first field emission type microfabricated electron emitter and the cathode of the second field emission type microfabricated electron emitter are connected in series in an integrated fashion.

19. The NAND element according to any of claims 16 to 18 wherein there is no overlapping area when the anode of said first field emission type microfabricated electron emitter and the gate electrode of said NAND element are projected on an element plane.

20. The NAND element according to claim 16, being operated at a voltage of no more than 10 V.

21. A logical operation circuit including the NAND element of claim 16 as a logical operation element.

22. A logical operation circuit including a NOR element and a NAND element as logical operation elements, wherein the NOR element is a NOR element of a design having the cathodes of two or more field emission type microfabricated electron emitters connected in parallel with a low potential power source or ground, two or more anodes corresponding to said emitters connected in parallel to a high potential power source through a passive element or an active element, the two or more anodes being substantially at the same potential, and gate electrodes corresponding to said emitters to receive two or more signal voltages, wherein the potential of said anodes is lowered by electron emission from the emitters when a high potential input signal is input to either of the two signals, and, wherein the NAND element is a NAND element wherein an anode of a first field emission type microfabricated electron emitter and a cathode of a second field emission type microfabricated electron emitter are connected in series and two signal voltages are applied to gate electrodes corresponding to the first emitter and the second emitter so that the anode potential of the second emitter is lowered when the two input signals are high potential.

* * * * *